(12) United States Patent
Jakobs

(10) Patent No.: US 7,120,077 B2
(45) Date of Patent: Oct. 10, 2006

(54) MEMORY MODULE HAVING A PLURALITY OF INTEGRATED MEMORY COMPONENTS

(75) Inventor: Andreas Jakobs, München (DE)

(73) Assignee: Infineon Technologies AG, Munich (DE)

( * ) Notice: Subject to any disclaimer, the term of this patent is extended or adjusted under 35 U.S.C. 154(b) by 176 days.

(21) Appl. No.: 10/776,178

(22) Filed: Feb. 12, 2004

(65) Prior Publication Data

US 2004/0184337 A1    Sep. 23, 2004

(30) Foreign Application Priority Data

Feb. 13, 2003  (DE) ............................... 103 06 062

(51) Int. Cl.
| | |
|---|---|
| *G11C 7/00* | (2006.01) |
| *G11C 8/00* | (2006.01) |
| *G06F 12/06* | (2006.01) |
| *H05K 1/14* | (2006.01) |
| *H05K 1/18* | (2006.01) |

(52) U.S. Cl. ..................... 365/222; 365/230.03; 711/5; 361/728; 361/736; 361/748; 361/760; 361/761

(58) Field of Classification Search ................ 361/728, 361/736, 748, 760, 761; 711/5; 365/222, 365/230.3

See application file for complete search history.

(56) References Cited

U.S. PATENT DOCUMENTS 5,345,574 A * 9/1994 Sakurada et al. ........... 711/115
5,731,945 A * 3/1998 Bertin et al. ................ 361/111
5,959,923 A * 9/1999 Matteson et al. ........... 365/222
6,094,705 A    7/2000 Song
6,385,113 B1* 5/2002 Longwell et al. .......... 365/222
6,873,563 B1* 3/2005 Suwa et al. ............. 365/230.03
6,917,549 B1* 7/2005 Proll et al. .................. 365/203
2003/0090879 A1* 5/2003 Doblar et al. ............... 361/728
2003/0145163 A1* 7/2003 Seo et al. .................... 711/106
2004/0027876 A1* 2/2004 Takahashi et al. .......... 365/200
2005/0155871 A1* 7/2005 Grant et al. ................. 205/787

FOREIGN PATENT DOCUMENTS

EP    0 626 695 B1    2/1999

* cited by examiner

*Primary Examiner*—Amir Zarabian
*Assistant Examiner*—Ly Duy Pham
(74) *Attorney, Agent, or Firm*—Edell, Shapiro & Finnan, LLC

(57) ABSTRACT

A memory module includes a plurality of integrated memory components are arranged on a mounting substrate and a refresh control circuit arranged separately from the memory components on the mounting substrate. The output of the refresh control circuit is connected to the plurality of integrated memory components. The refresh control circuit receives and processes address or command signals which have been generated outside the memory module; based on the access information obtained therefrom, independently generates a refresh command or a refresh command sequence for refreshing the contents of memory cells in a selected one of the memory components; and transmits the command or command sequence to the selected memory component. Refresh commands of this type no longer have to be generated by a memory controller.

10 Claims, 3 Drawing Sheets

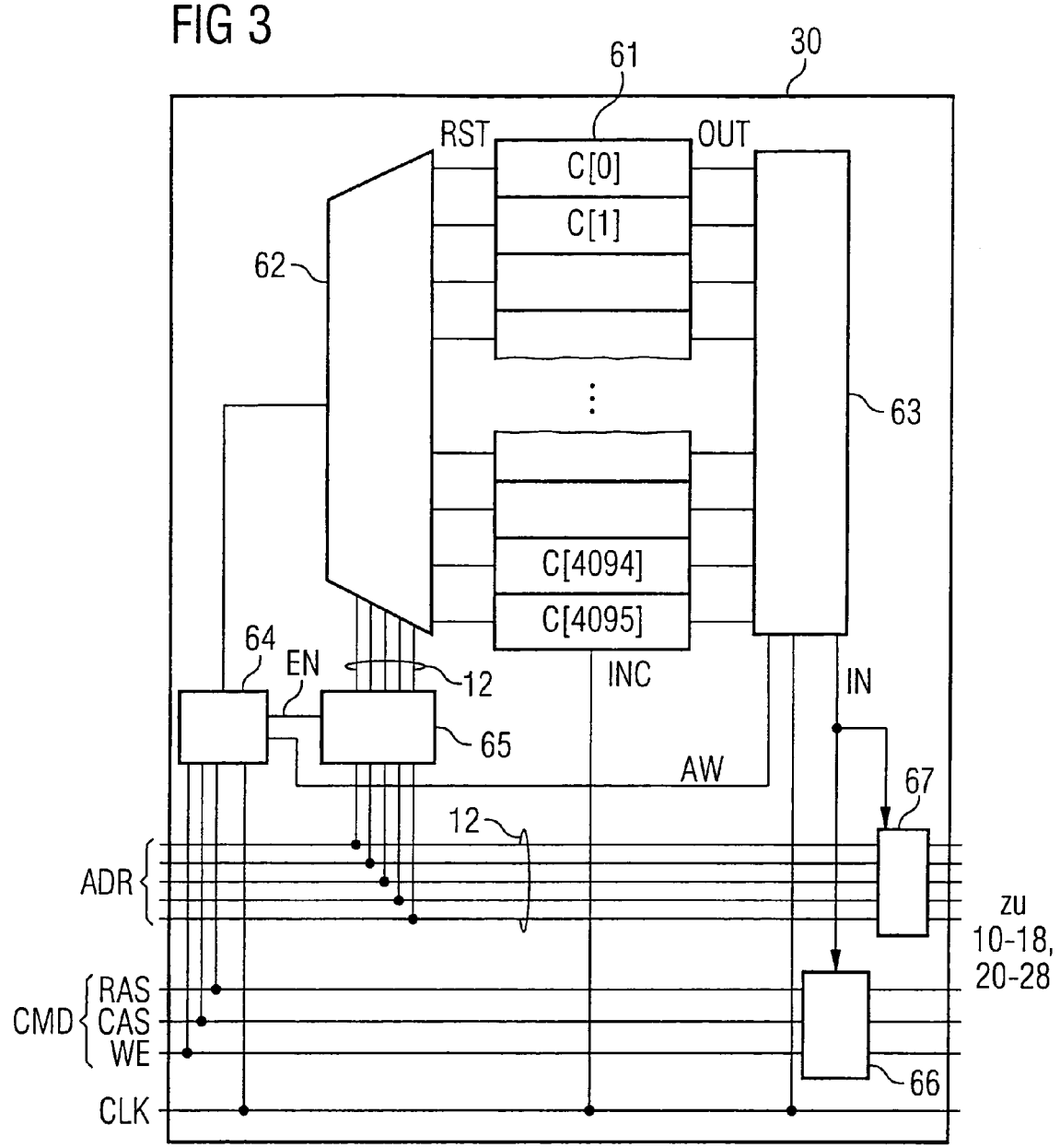

MEMORY MODULE HAVING A PLURALITY OF INTEGRATED MEMORY COMPONENTS

CROSS REFERENCE TO RELATED APPLICATIONS

This application claims priority under 35 USC §119 to German Application No. 10306062.6, filed on Feb. 13, 2003, and titled "Memory Module Having a Plurality of Integrated Memory Components," the entire contents of which are hereby incorporated by reference.

FIELD OF THE INVENTION

The present invention relates to a memory module having a plurality of integrated memory components, which are arranged on a mounting substrate.

BACKGROUND

In computer systems, for example, it is known practice to arrange a plurality of memory components, for instance, in the form of "DRAMs" (Dynamic Random Access Memories), on a common mounting substrate. Memory arrangements of this type are known, in particular, as "DIMMs" (Registered or Buffered Dual Inline Memory Modules). "DIMMS" are typically fitted with 16 or 18 memory chips, which are clock-controlled when of "SDRAMs" or "DDR DRAMs".

An integrated dynamic memory in the form of a DRAM generally has a memory cell array which comprises word lines and bit lines. In this case, the memory cells are arranged at crossover points between the bit lines and word lines. In particular, the memory cells have a storage capacitor and a selection transistor, with the selection transistor connecting the associated storage capacitor to one of the bit lines. Control connections on the respective selection transistors are respectively connected to one of the word lines for the purpose of selecting the memory cells. An activated word line turns on respective connected selection transistors, in which case, following the selection of a word line, data signals from the memory cells along the selected word line are applied to the corresponding bit lines. A data signal from a selected memory cell is assessed and amplified in a sense amplifier in the memory cell array. In the case of read access, the data signals from selected memory cells are read out for the purpose of further processing, and in the case of write access, data signals to be written are written to the selected memory cells.

In the case of integrated dynamic memories of this type, a "refresh mode" is required, at times of operation at which the memory cells are not being externally accessed, to refresh and thus permanently retain the memory cell contents, which may vanish, for example, as a result of leakage currents in the storage capacitor or selection transistor. In the refresh mode, the assessed and amplified data signals from selected memory cells are written back directly to the memory cells in question.

Integrated memories such as DRAMs are used in data processing systems such as, for example, computer systems, where they are driven, for example, by a microprocessor or microcontroller. In this case, a memory module in the form of a DIMM is arranged in a known manner, for example, in a slot in a "motherboard" in the computer system, and communicates with the microprocessor or microcontroller via corresponding conductor tracks on the motherboard. In order to initiate a refresh sequence in a memory on a DIMM, which is operated in this manner, an external command, for instance an "autorefresh" command, is normally required. The command is periodically applied by the microprocessor or microcontroller, for example, in the form of a memory controller. In order to be able to achieve a functionality of this type, it is necessary to equip the microprocessor or microcontroller with appropriate registers or switching mechanisms. However, this generally increases the design complexity of a chip of this type.

SUMMARY

The present invention can specify a memory module, which, when used in a data processing system, can reduce the design complexity of a memory controller in the data processing system.

The memory module can include a plurality of integrated memory components and a refresh control circuit, which is arranged separately from the memory components on the mounting substrate. The refresh control circuit can be connected, at the output, to the plurality of integrated memory components. The refresh control circuit can be designed such that it can independently generate a refresh command or a refresh command sequence for refreshing the contents of memory cells in a selected one of the memory components and transmits the command or command sequence to the selected memory component.

The mounting substrate can include connections for supplying address and command signals. The refresh control circuit can be connected, at the input, to the connections for supplying the address and command signals and can be designed such that, when address or command signals which have been generated outside the memory module are supplied, it can receive and process the signals and, based on access information obtained therefrom, can independently send a refresh command or a refresh command sequence. In particular, command signals can be evaluated with regard to a defined command pattern and the point in time at which a refresh command or a refresh command sequence will be sent can be independently determined therefrom. In this case, the command signals can be evaluated, for example, by a heuristic algorithm. An algorithm of this type can be used to identify when a pause in a command sequence is "suitable" for sending a refresh command.

In accordance with the invention, the memory module, for example, in the form of a DIMM, can be complemented by a circuit, which is capable of independently generating a refresh command (required by a DRAM) or a refresh command sequence for refreshing the contents of memory cells. Refresh commands or refresh command sequences of this type therefore no longer have to be generated by a memory controller, for example, in a computer system, with the result that the controller is free of the burden of a functionality of this type. As a result, the design complexity of a memory controller may be reduced. Also, a greater bandwidth on a command bus, for instance, on a motherboard, can be available for other access operations.

In a further embodiment, an adjustable time value has been set in the refresh control circuit. The time value can determine the time within which the contents of memory cells in a corresponding memory component are to be refreshed. The refresh control circuit can send a refresh command or a refresh command sequence based on this adjustable time value.

In a further embodiment, the refresh control circuit can ascertain which rows in a memory cell array (organized in the form of a matrix) in a selected memory component have not been accessed in a defined period of time (for example, 1 to 2 µs). The point in time at which a refresh command or a refresh command sequence will be sent can be independently determined on the basis of this evaluation. Those rows in a memory cell array, which have not been accessed for a relatively long period of time, can be subject to a refresh operation.

In one preferred embodiment, the refresh control circuit can be arranged within a semiconductor chip which is separate from the memory components.

BRIEF DESCRIPTION OF THE DRAWINGS

The invention is explained in more detail below with reference to the figures, which represent exemplary embodiments of the present invention and are illustrated in the drawing, in which:

FIG. 3 shows an embodiment of a set of counter circuits having an associated drive and evaluation circuit.

DETAILED DESCRIPTION

Figure 1:
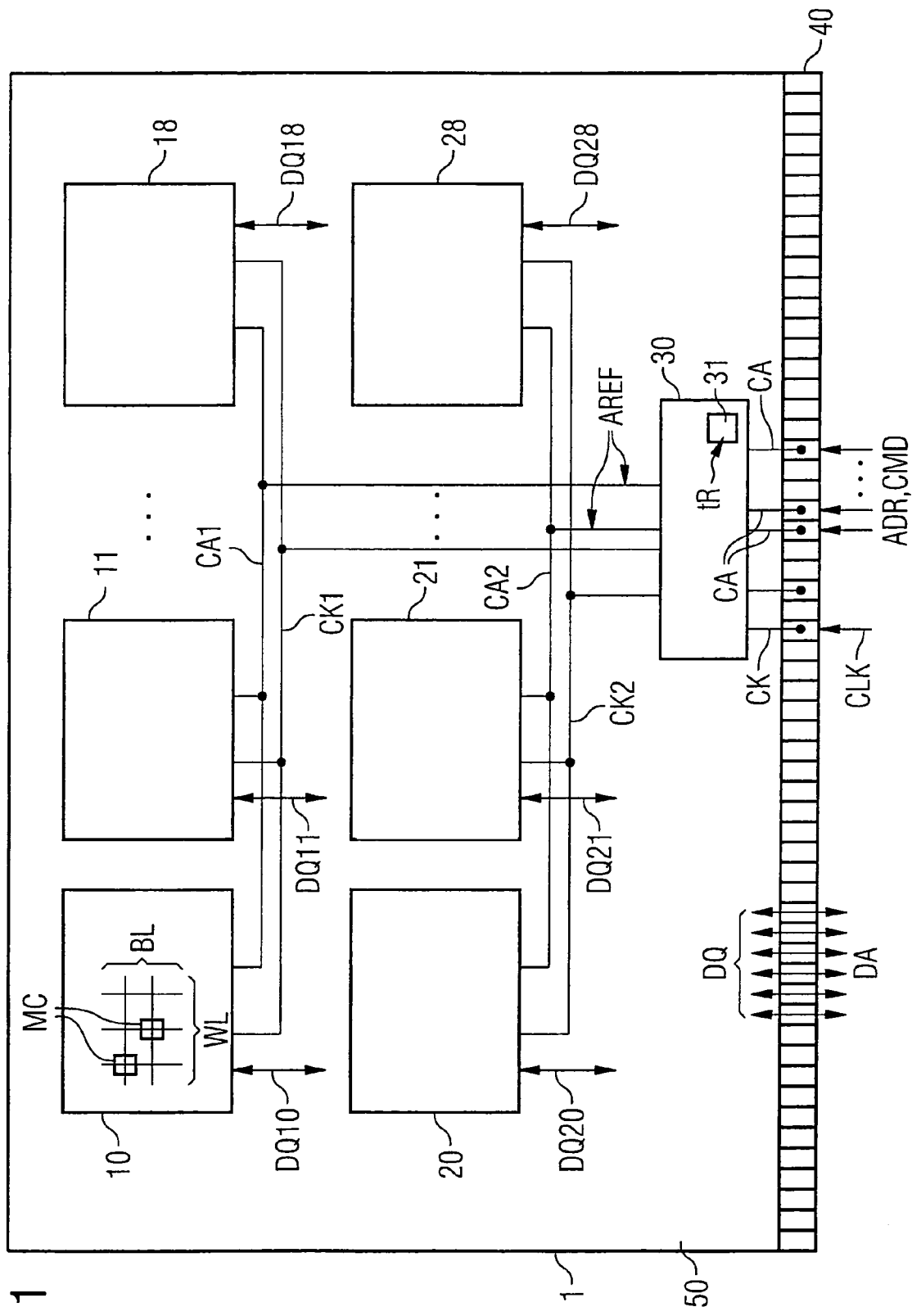
FIG. 1 shows an embodiment of a memory module in accordance with the invention.

Referring to FIG. 1, an embodiment of a memory module in accordance with the invention, shown in a roughly diagrammatic manner is a DIMM module arrangement. The DIMM module arrangement can include a plurality of integrated memory components, for example, in the form of DRAM stores 10, 11, 12, 13, 14, 15, 16, 17, 18 and 20, 21, 22, 23, 24, 25, 26, 27, 28, arranged on a mounting substrate 50. A refresh control circuit, 30 which is connected to a command and address bus CA and to a clock signal line CK, can be arranged separately from the memory components 10, 11, 12, 13, 14, 15, 16, 17, 18 and 20, 21, 22, 23, 24, 25, 26, 27, 28 on the mounting substrate 50. The input connection of the refresh circuit 30 can be connected to the contact strip 40 on the memory module 1. The contact strip can have connections for inputting and outputting data signals DA, connections for inputting a clock signal CLK and connections for inputting address signals ADR and command signals CMD.

At the input, the refresh control circuit 30 can be connected to the respective connections on the contact strip 40 for supplying the address signals ADR and command signals CMD. At the output, the refresh control circuit can be connected to a command and address bus CA1 for the first "memory rank" having the memories 10, 11, 12, 13, 14, 15, 16, 17, 18 and also to a command and address bus CA2 for the second memory rank having the memories 20, 21, 22, 23, 24, 25, 26, 27, 28. In addition, the refresh control circuit 30 can be connected, at the output, to the clock signal line CK1 for driving the memories 10, 11, 12, 13, 14, 15, 16, 17, 18 in the first memory rank and to the clock signal line CK2 for driving the second memory rank having the memories 20, 21, 22, 23, 24, 25, 26, 27, 28. For the purpose of interchanging data, the memories 10, 11, 12, 13, 14, 15, 16, 17, 18 and 20, 21, 22, 23, 24, 25, 26, 27, 28 can have respective data connections DQ10 to DQ18 and DQ20 to DQ28, which can be connected to the data connections DQ on the memory module 1.

As shown in more detail by the memory 10, for example, the individual memory components can have memory cell arrays having word lines WL for selecting memory cells MC and bit lines BL for reading data signals from, or writing data signals to, the memory cells MC. The memory cells MC can be arranged in a known manner at crossover points between the word lines WL and bit lines BL and are, respectively, connected to one of the word lines and one of the bit lines. The memory cells MC each can have a selection transistor and storage capacitor (not shown), with the control input of the transistors being connected to a word line WL which activates connected memory cells MC in the event of memory access.

The refresh control circuit 30 can be designed such that it can independently generate a refresh command AREF for refreshing the contents of memory cells MC in a selected memory component in the memory module 1 and transmits the command to the latter. In particular, address and/or command signals ADR, CMD, which have been generated outside the memory module 1 can be received and processed, with the refresh control circuit 30 independently sending a refresh command AREF on the basis of access information obtained from the signals. In particular, the refresh control circuit 30 can evaluate the command signals CMD with regard to a defined command pattern and independently determine therefrom the point in time at which a refresh command AREF will be sent. The refresh control circuit 30 may be operated such that it can switch the command and address signals ADR, CMD received at the contact strip 40 through to the respective memory components in the memory module 1, but more or less "concomitantly reads" the applied command and address signals. When a suitable pause in the command sequence, particularly a defined command pattern, is detected by a heuristic algorithm, for instance, the refresh control circuit 30 can independently determine a suitable point in time at which a refresh command will be sent.

As an alternative to a refresh command such as, for example, an "autorefresh" command with internal address generation by a counter, it is also possible to generate a refresh command sequence. In this case, in particular, an activation command for activating an addressed row (which is to be refreshed) and, after a certain minimum amount of time ("tRAS"), a precharge command can be respectively sent.

In another embodiment, an adjustable time value tR indicates the time within which the contents of memory cells in a corresponding memory component to be refreshed can be set in a register 31 in the refresh control circuit 30. Since the memory components 10, 11, 12, 13, 14, 15, 16, 17, 18 and 20, 21, 22, 23, 24, 25, 26, 27, 28 can: generally be of the same type, it suffices, in a case such as this, to store a common time value tR, for instance, of the order of magnitude of 4 µs to 8 µs. Once the set time tR since the last memory cell access has passed, the corresponding memory cell can be subject to a refresh operation.

In an alternative embodiment, the refresh control circuit can ascertain which of the rows or word lines WL in a selected memory component have not been accessed in a defined period of time (for example, 1 to 2 µs). Based on this evaluation, the refresh control circuit 30 can determine the point in time at which a refresh command AREF will be sent and word line units of this type will be refreshed.

To this end, the memory module 1 has a respective set 61 of counter circuits for independently operated units of word lines WL (for instance, for individual memory banks which are driven separately from one another), as is shown in FIG. 3. For the sake of clarity, FIG. 3 shows one set 61 with an associated drive and evaluation circuit with the individual counter circuits C[0] to C[4095] in a set being associated with a respective different word line WL in the corresponding unit of rows. In the present case, the counter circuits C[0] to C[4095] can be binary counters which count, for example, up to 1000 or 2000 (corresponds to 1 or 2 µs) and can be reset to the associated row in the event of access.

The decoder 64 can ascertain when a memory is accessed via the command signals RAS, CAS, WE. A register 65 can be activated via an activation signal EN in order to store the applied address ADR in the register. In addition, a multiplexer 62 can be actuated. The multiplexer can determine which of the counter circuits C[0] to C[4095] is reset via the reset signal RST. That counter circuit, which is associated with the word line WL, which can currently be accessed is reset. The left-hand half of the circuit shown in FIG. 3 thus determines which counter circuit is reset. The counter circuits in the set 61 can be incremented via the signal INC derived from the clock signal CLK.

The signal OUT can be used to either read out or display the count of each counter when a counter has exceeded a particular value (see the numerical example above). This can be evaluated by the control circuit 63. The supply of an authorization signal AW by the decoder 64 can indicate to the control circuit 63 when a refresh command may be sent. In this case, a refresh command can be fed via the command feed circuit 66 by the signal IN to the command bus for forwarding to the corresponding unit of word lines WL. Upon generation of a refresh command sequence having a row, which is to be addressed, a corresponding command sequence can be fed via the command feed circuit 66 to the command bus and an associated row address can be fed via the address feed circuit 67 to the address bus.

The refresh control circuit 30 having the components 63, 64, 66 and 67 described thus can evaluate the counter circuits with respect to their count and, based on this evaluation, can independently determine the point in time at which a refresh command or a refresh command sequence will be sent. In particular, a refresh command or a refresh command sequence can be sent when a counter circuit has reached a limit value, for instance, one of the values mentioned above by way of example. This therefore can implement a table from which it can be gathered which of the word lines WL have not been accessed for a relatively long time. Entries of this type are detected by the refresh control circuit 30 and a corresponding refresh command or a refresh command sequence for refreshing the memory cells along this word line is sent.

Figure 2:
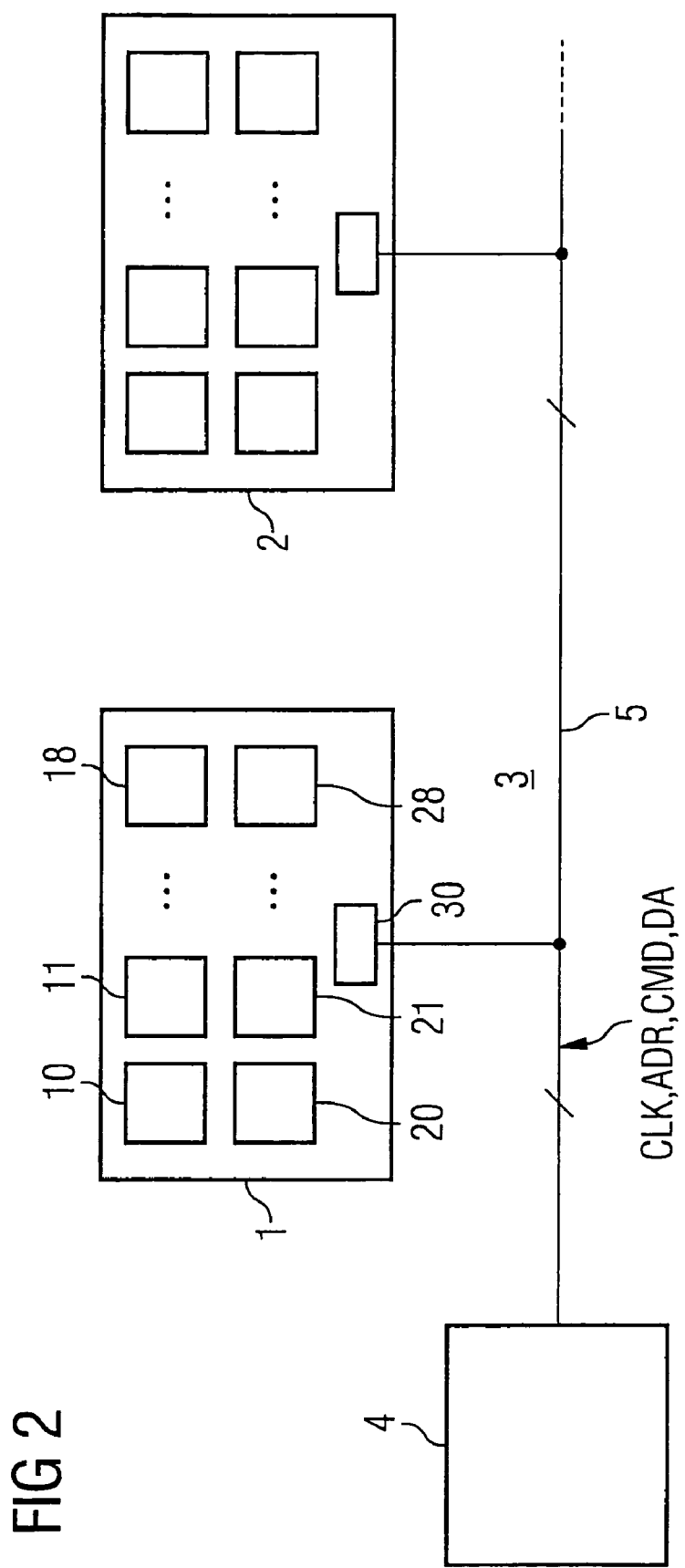
FIG. 2 shows an embodiment of a computer system having a memory controller and a plurality of memory modules in accordance with the invention.

FIG. 2 diagrammatically shows an embodiment of an exemplary computer system having a memory controller 4 and a plurality of memory modules 1, 2, which have been designed in accordance with the invention. The memory controller 4 can be connected to a transmission bus 5, with both being situated on a motherboard 3 in the computer system. The DIMM modules 1 and 2 are connected to the transmission bus 5 via plug-in connectors. The clock signal CLK, address signals ADR, command signals CMD and data signals DA can be transmitted to the DIMM modules 1, 2 on the transmission bus 5. A refresh command is not transmitted by the memory controller 4, since this functionality can be implemented in accordance with the invention on the respective DIMM.

While the invention has been described in detail and with reference to specific embodiments thereof, it will be apparent to one skilled in the art that various changes and modifications can be made therein without departing from the spirit and scope thereof. Thus, it is intended that the present invention covers the modifications and variations of this invention provided they come within the scope of the appended claims and their equivalents.

List of Reference Symbols

| | |
|---|---|
| 2, 3 | Sense amplifier strip |
| 10 | Memory |
| 11, 12, 13, 14 | Memory cell array |
| 20 | Address decoder |
| WL, WL1, WL2 | Word line |
| BL1, BL2, BL4 | Bit line |
| BL1c, BL1t | Bit line |
| BL2c, BL2t | Bit line |
| SL, SR | Control line |
| T11 to T22 | Isolation transistor |
| AT1, AT2 | Selection transistor |
| C1, C2 | Memory cell capacitance |
| MC1, MC2 | Memory cell |
| TW | Bit line twist |
| SA21 to SA23 | Sense amplifier |
| SA31 | Sense amplifier |
| a1, a2 | Distance |
| B | Region |
| RADR | Row address |
| ACT(WL) | Activation signal |
| TS1, TS2 | Activation circuit |

What is claimed is:

1. A memory module, comprising:
a mounting substrate, wherein the substrate comprises connections for supplying address and command signals;
a plurality of integrated memory components arranged on the mounting substrate, wherein each of the memory components comprises a memory cell array including rows and columns;
a refresh control circuit that is arranged separately from the memory components on the mounting substrate, wherein an output of the refresh control circuit is connected to the plurality of integrated memory components and an input of the refresh control circuit is connected to the connections for supplying the address and command signals; and
a respective set of counter circuits for independently operated units of rows, wherein the individual counter circuits within a set are associated with a respective different row in the corresponding unit of rows, and a respective counter circuit is reset when an associated row is accessed;
wherein the refresh control circuit is designed such that:
when address or command signals, which have been generated outside the memory module, are supplied, the refresh control circuit receives and processes the signals, based on the access information obtained therefrom, the refresh control circuit independently generates a refresh command for refreshing the contents of memory cells in a selected one of the memory components, and the refresh control circuit transmits the refresh command to the selected memory component; and
the refresh control circuit ascertains which rows in a selected memory component have not been accessed in a predefined period of time and, based on this evaluation, the refresh control circuit independently determines a point in time at which the refresh command will be sent, the refresh control circuit being configured to evaluate the counter circuits with respect to a count and, based on such evaluation, independently determining the point in time at which the refresh command will be sent.

2. The memory module as claimed in claim 1, wherein the refresh control circuit is arranged within a semiconductor chip, the semiconductor chip being separate from the memory components.

3. The memory module as claimed in claim 1, wherein the input connection of the refresh control circuit is connected to a contact strip on the memory module.

4. The memory module as claimed in claim 1, wherein the memory module is in the form of a DIMM module arrangement.

5. The memory module as claimed in claim 1, wherein the memory components in the memory module are dynamic read/write memories.

6. A memory module, comprising:
   a mounting substrate, wherein the substrate comprises connections for supplying address and command signals;
   a plurality of integrated memory components arranged on the mounting substrate, wherein the memory components each comprises a memory cell array including rows and columns;
   a refresh control circuit that is arranged separately from the memory components on the mounting substrate, wherein an output of the refresh control circuit is connected to the plurality of integrated memory components and an input of the refresh control circuit is connected to the connections for supplying the address and command signals; and
   a respective set of counter circuits for independently operated units of rows, wherein the individual counter circuits within a set are associated with a respective different row in the corresponding unit of rows, and a respective counter circuit is reset when an associated row is accessed;
   wherein the refresh control circuit is designed such that:
   when address or command signals, which have been generated outside the memory module, are supplied, the refresh control circuit receives and processes the signals, based on the access information obtained therefrom, the refresh control circuit independently generates a refresh command sequence for refreshing the contents of memory cells in a selected one of the memory components, and the refresh control circuit transmits the command sequence to the selected memory component; and
   the refresh control circuit ascertains which rows in a selected memory component have not been accessed in a predefined period of time and, based on this evaluation, the refresh control circuit independently determines a point in time at which the refresh command sequence will be sent, the refresh control circuit being configured to evaluate the counter circuits with respect to a count and, based on such evaluation, independently determining the point in time at which the refresh command sequence will be sent.

7. The memory module as claimed in claim 6, wherein the refresh control circuit is arranged within a semiconductor chip, the semiconductor chip being separate from the memory components.

8. The memory module as claimed in claim 6, wherein the input connection of the refresh control circuit is connected to a contact strip on the memory module.

9. The memory module as claimed in claim 6, wherein the memory module is in the form of a DIMM module arrangement.

10. The memory module as claimed in claim 6 wherein the memory components in the memory module are dynamic read/write memories.

* * * * *